(12) United States Patent
Mochiki et al.

(10) Patent No.: US 9,496,150 B2
(45) Date of Patent: *Nov. 15, 2016

(54) ETCHING PROCESSING METHOD

(71) Applicant: TOKYO ELECTRON LIMITED, Tokyo (JP)

(72) Inventors: Hiromasa Mochiki, Yamanashi (JP); Shin Okamoto, Yamanashi (JP); Takashi Nishijima, Yamanashi (JP); Fumio Yamazaki, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 19 days.

This patent is subject to a terminal disclaimer.

(21) Appl. No.: 14/576,574

(22) Filed: Dec. 19, 2014

(65) Prior Publication Data

US 2015/0170933 A1   Jun. 18, 2015

Related U.S. Application Data

(63) Continuation of application No. 12/943,323, filed on Nov. 10, 2010.

(60) Provisional application No. 61/377,493, filed on Aug. 27, 2010, provisional application No. 61/282,663, filed on Mar. 15, 2010.

(30) Foreign Application Priority Data

Feb. 24, 2010 (JP) .................................. 2010-039001
Aug. 10, 2010 (JP) .................................. 2010-179415

(51) Int. Cl.
   *H01L 21/302*  (2006.01)
   *H01L 21/461*  (2006.01)
   *B44C 1/22*    (2006.01)
   (Continued)

(52) U.S. Cl.
   CPC .... *H01L 21/31116* (2013.01); *H01J 37/32091* (2013.01); *H01J 37/32165* (2013.01); *H01L 21/0273* (2013.01); *H01L 21/31122* (2013.01); *H01L 21/31138* (2013.01); *H01L 21/31144* (2013.01); *H01L 21/32137* (2013.01)

(58) Field of Classification Search
   None
   See application file for complete search history.

(56) References Cited

U.S. PATENT DOCUMENTS 7,022,611 B1    4/2006  Keil et al.
2004/0259367 A1  12/2004  Constantine et al.
(Continued)

FOREIGN PATENT DOCUMENTS

JP  2004-353066 A  12/2004
JP  2007-134530 A   5/2007
(Continued)

*Primary Examiner* — Stephanie Duclair
(74) *Attorney, Agent, or Firm* — Rothwell, Figg, Ernst & Manbeck, P.C.

(57) ABSTRACT

An etching processing method for etching a substrate formed with a target film and a mask film is performed in a substrate processing apparatus including a first and a second power supply for respectively supplying a higher and a lower high frequency power to a processing space and a mounting table, and a DC power supply for supplying a DC power to an electrode. The method includes a modification step for modifying a shape of a pattern formed on the mask film; and an etching step for etching the target film by using the mask film. The mask film is etched by the plasma in the modification step. Further, in the etching step, the DC power is applied to the electrode and the lower high frequency power is applied to the mounting table in a pulse wave form in which a higher and a lower power level are repeated.

21 Claims, 18 Drawing Sheets

(51) Int. Cl.
*C03C 25/68* (2006.01)
*C03C 15/00* (2006.01)
*C23F 1/00* (2006.01)
*H01L 21/311* (2006.01)
*H01J 37/32* (2006.01)
*H01L 21/027* (2006.01)
*H01L 21/3213* (2006.01)

(56) References Cited

U.S. PATENT DOCUMENTS

| | | |
|---|---|---|
| 2005/0048787 A1 | 3/2005 | Negishi et al. |
| 2005/0112891 A1 | 5/2005 | Johnson et al. |
| 2007/0009836 A1 | 1/2007 | Yanagisawa |
| 2008/0110859 A1 | 5/2008 | Koshiishi et al. |
| 2008/0122107 A1 | 5/2008 | Tsai et al. |
| 2008/0233757 A1 | 9/2008 | Honda et al. |
| 2009/0121324 A1 | 5/2009 | Sadjadi et al. |
| 2010/0003828 A1 | 1/2010 | Ding et al. |

FOREIGN PATENT DOCUMENTS

| | | |
|---|---|---|
| JP | 2008-60566 A | 3/2008 |
| JP | 2008-538857 A | 11/2008 |
| JP | 2009-246091 A | 10/2009 |
| JP | 2009-246183 A | 10/2009 |
| JP | 2010-500758 A | 1/2010 |

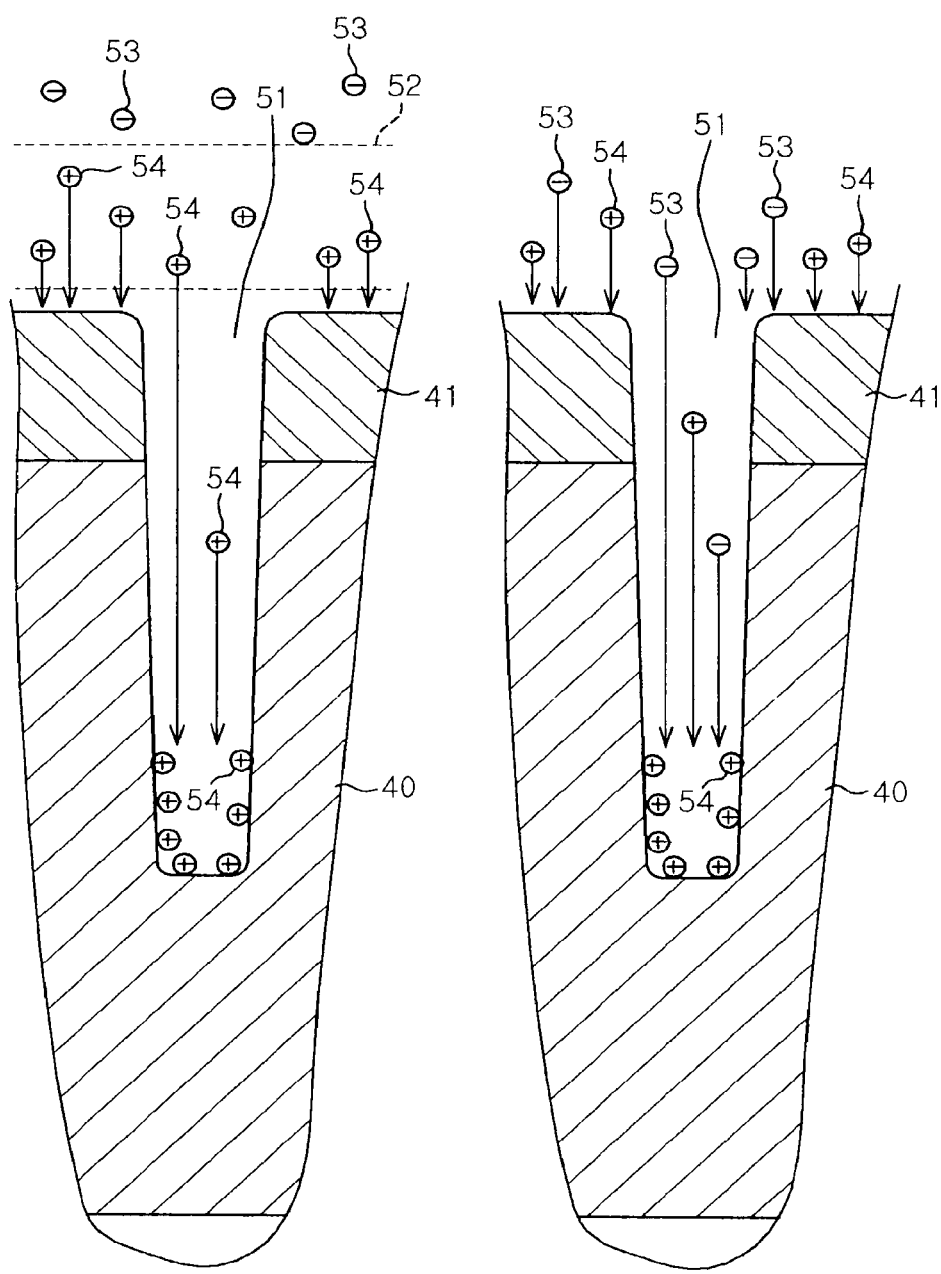

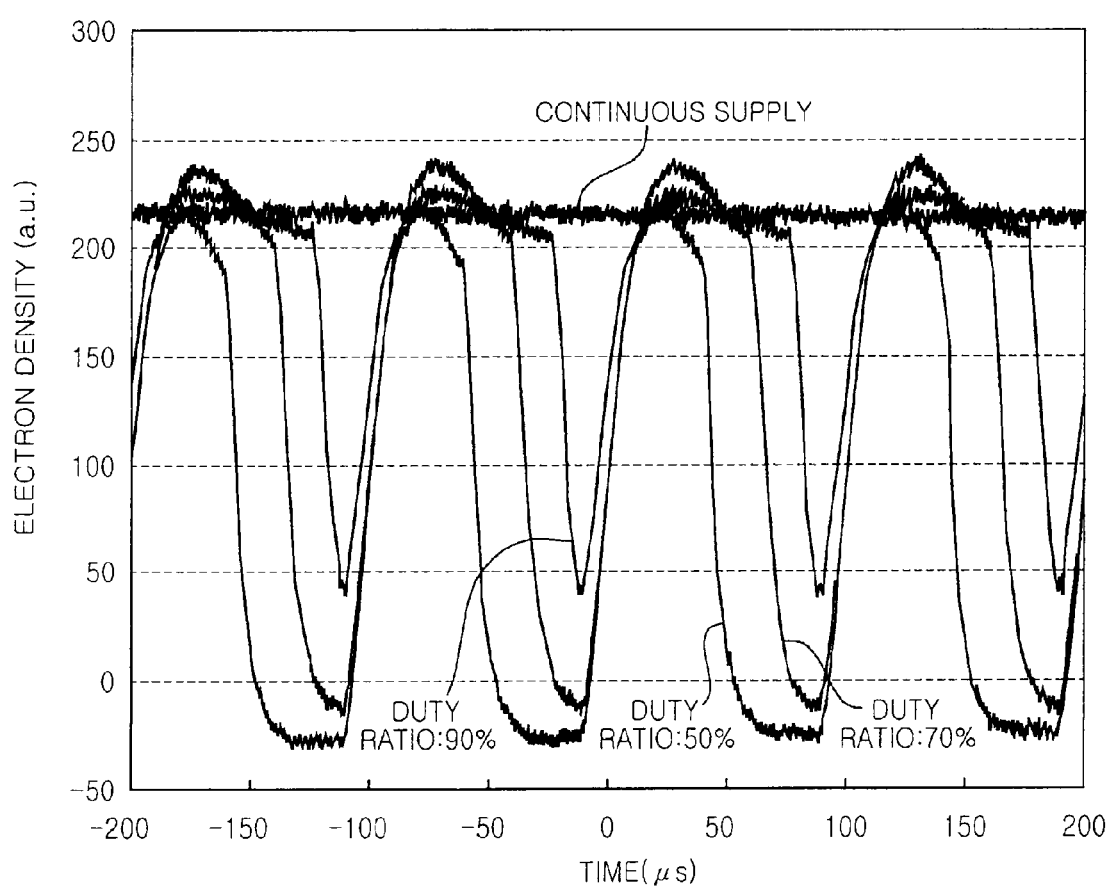

ETCHING PROCESSING METHOD

CROSS REFERENCE TO RELATED APPLICATIONS

This application claims the benefit of priority of each of the following applications and describes the relationship of the earlier applications. The present application is a Continuation Application of and claims the benefit of priority from co-pending U.S. application Ser. No. 12/943,323, filed Nov. 10, 2010, and also claims the benefit of priority from U.S. Provisional Application Nos. 61/377,493, filed Aug. 27, 2010 and 61/282,663, filed Mar. 15, 2010. The present application is further based upon and claims the benefit of priority from the prior Japanese Patent Application Nos. 2010-039001, filed Feb. 24, 2010 and 2010-179415, filed Aug. 10, 2010. The benefit of priority is claimed to each of the foregoing, and entire contents of each of the foregoing are incorporated herein by reference.

FIELD OF THE INVENTION

The present invention relates to an etching processing method for forming a hole or the like having a high aspect ratio.

BACKGROUND OF THE INVENTION

In a semiconductor device manufactured from a semiconductor wafer by using a plasma etching apparatus, it is required to form a pattern having a relatively large depth compared to a diameter thereof, e.g., a hole having a high aspect ratio.

In order to form a hole having a high aspect ratio, a target film needs to be sputtered especially by positive ions in the plasma. In that case, as shown in FIG. 12, positive ions 122 remain at a bottom portion of a hole 121 formed in a target film 120 and electrically prevent succeeding positive ions 123 from approaching the bottom portion of the hole 121, which causes the path of the positive ions 123 inside the hole 121 to be changed. Accordingly, the problem such as deformation of the hole 121 or the like may occur.

For that reason, there has been developed a technique for introducing electrons into the bottom portion of the hole (see, e.g., Japanese Patent Application Publication No. 2007-134530). Thus, the positive ions remaining at the bottom portion of the hole are electrically neutralized so that the path of the succeeding positive ions is not varied.

However, along with the trend toward miniaturization of each unit, it is required to form a hole having a high aspect ratio, e.g., a hole having an aspect ratio of about 30 or higher, in a target film. When the hole has an aspect ratio of about 30 or higher, it is difficult to prevent the hole from being deformed even by using the above-described technique.

SUMMARY OF THE INVENTION

In view of the above, the present invention provides an etching processing method capable of preventing deformation of a pattern even when it has a high aspect ratio thereof.

In accordance with an aspect of the present invention, there is provided an etching processing method for performing an etching process on a substrate mounted on a mounting table, the substrate having an etching target film and a mask film formed thereon, by using a substrate processing apparatus including a processing space where a plasma is generated, the mounting table provided in the processing space, an electrode disposed in the processing space to face the mounting table, a first high frequency power supply for supplying a first high frequency power into the processing space, a second high frequency power supply for supplying to the mounting table a second high frequency power having a frequency lower than a frequency of the first high frequency power, and a DC power supply for supplying a DC power to the electrode. The etching processing method includes a pattern shape modification step for modifying a shape of a pattern formed on the mask film on the substrate; and a target film etching step for plasma-etching the etching target film by using the mask film having the pattern whose shape is modified. In the pattern shape modification step, the mask film is etched by the plasma, and, in the target film etching step, the DC power is applied to the electrode and the second high frequency power is applied to the mounting table in a pulse wave form in which a first power level and a second power level lower than the first power level are repeated.

In the target film etching step, a state in which the first high frequency power is not applied into the processing space may be obtained by applying the first high frequency power in a pulse wave form into the processing space.

In the target film etching step, the first high frequency power and the second high frequency power may be synchronously applied in a pulse wave form.

In the target film etching step, the DC power may be applied to the electrode, the DC power having a potential lower than a potential of a bias voltage generated on the substrate.

In the target film etching step, the second high frequency power having a frequency ranging from about 1 KHz to 50 KHz may preferably be applied in a pulse wave form to the mounting table.

More preferably, the frequency may range from about 10 KHz to 50 KHz.

In the target film etching step, a duty ratio of the second high frequency power applied in a pulse wave form may preferably range from about 10% to 90%.

More preferably, the duty ratio may range from about 50% to 90%.

In the target film etching step, a state in which the second high frequency power is not applied to the mounting table may preferably be continued for at least about 5 μsec.

In the target film etching step, the pattern formed in the etching target film may preferably have an aspect ratio of about 30 or higher.

The mask film may be an organic film, and the method may further include, between the pattern shape modification step and the target film etching step, a mask film hardening step for hardening the mask film by bringing electrons into contact with the mask film etched by the plasma.

In the mask film hardening step, the DC power may be applied to the electrode.

In the mask film hardening step, the DC power may preferably have a voltage of about −900 V or less.

In the mark film hardening step, the plasma may be generated from a depositive gas.

The mask film may be an inorganic film.

The inorganic film may have at least a polysilicon film.

In the pattern shape modification step, the shape of the hole formed in the mask film may become a substantially round circle when viewed from above by modifying the shape of the pattern.

In the target film etching step, the plasma may be generated from a gaseous mixture containing at least He gas.

With the present invention, there is provided an etching processing method capable of preventing deformation of a pattern in spite of a high aspect ratio thereof.

BRIEF DESCRIPTION OF THE DRAWINGS

The objects and features of the present invention will become apparent from the following description of embodiments, given in conjunction with the accompanying drawings, in which:

FIGS. 2A to 2G illustrate a shape of a hole formed in an oxide film by a conventional etching processing method, wherein FIG. 2A is a vertical cross sectional view of the hole formed in the oxide film; FIG. 2B is a horizontal cross sectional view of the hole at a depth of about 300 mm from the surface of the oxide film; FIG. 2C is a horizontal cross sectional view of the hole at a depth of about 700 mm from the surface of the oxide film; FIG. 2D is a horizontal cross sectional view of the hole at a depth of about 1500 mm from the surface of the oxide film; FIG. 2E is a horizontal cross sectional view of the hole at a depth of about 2300 mm from the surface of the oxide film; FIG. 2F is a vertical cross sectional view of a mask film before the hole is formed in the oxide film; and FIG. 2G is a top view of a hole formed in the mask film shown in FIG. 2F;

FIGS. 5A to 5C explain a modification process of the shape of the hole formed in the mask film by the etching processing method of the first embodiment, wherein FIG. 5A is a vertical cross sectional view showing the vicinity of the hole formed in the mask film; FIG. 5B is a top view of the hole formed in the mask film before the shape modification process; and FIG. 5C is a top view of the hole formed in the mask film after the shape modification process; and FIGS. 6A to 6C explain a hardening process of the mask film in the etching processing method of the first embodiment, wherein FIG. 6A is a vertical cross sectional view showing the vicinity of the hole formed in the mask film; FIG. 6B is a top view of the hole formed in the mask film before the hardening process; and FIG. 6C is a top view of the hole formed in the mask film after the hardening process;

FIGS. 7A and 7B explain a forming process of a hole in an $SiO_2$ film in accordance with the etching processing method of the first embodiment, wherein FIG. 7A explains etching of the $SiO_2$ film, and FIG. 7B explains electrical neutralization of positive ions remaining at the bottom portion of the hole;

FIGS. 11A to 11C explain a modification process of a shape of a hole formed in a mask film in the etching processing method of the second embodiment, wherein FIG. 11A is a vertical cross sectional view showing the vicinity of the hole formed in the mask film; FIG. 11B is a top view of the hole formed in the mask film before the shape modification process; and FIG. 11C is a top view of the hole formed in the mask film after the shape modification process;

FIGS. 13A and 13B explain a modulation of application of a high frequency power in the etching processing method of the first embodiment, wherein FIG. 13A shows a modulated state of the application of the high frequency power for ion attraction, and FIG. 13B shows a waveform of the high frequency power for ion attraction in the case of repeating ON/OFF of the high frequency power for ion attraction;

FIGS. 14A and 14B explain an adhesion shape of deposits in the hole, wherein FIG. 14A shows the case of continuous application, and FIG. 14B shows the case of pulse wave form application;

FIG. 15 explains variations in an electron density in a processing space in the case of continuous application and pulse wave form application;

FIGS. 17A and 17B illustrate an adhesion shape of radicals, wherein FIG. 17A shows the case of continuous application, and FIG. 17B shows the case of pulse wave form application.

DETAILED DESCRIPTION OF THE EMBODIMENT

Figure 1:
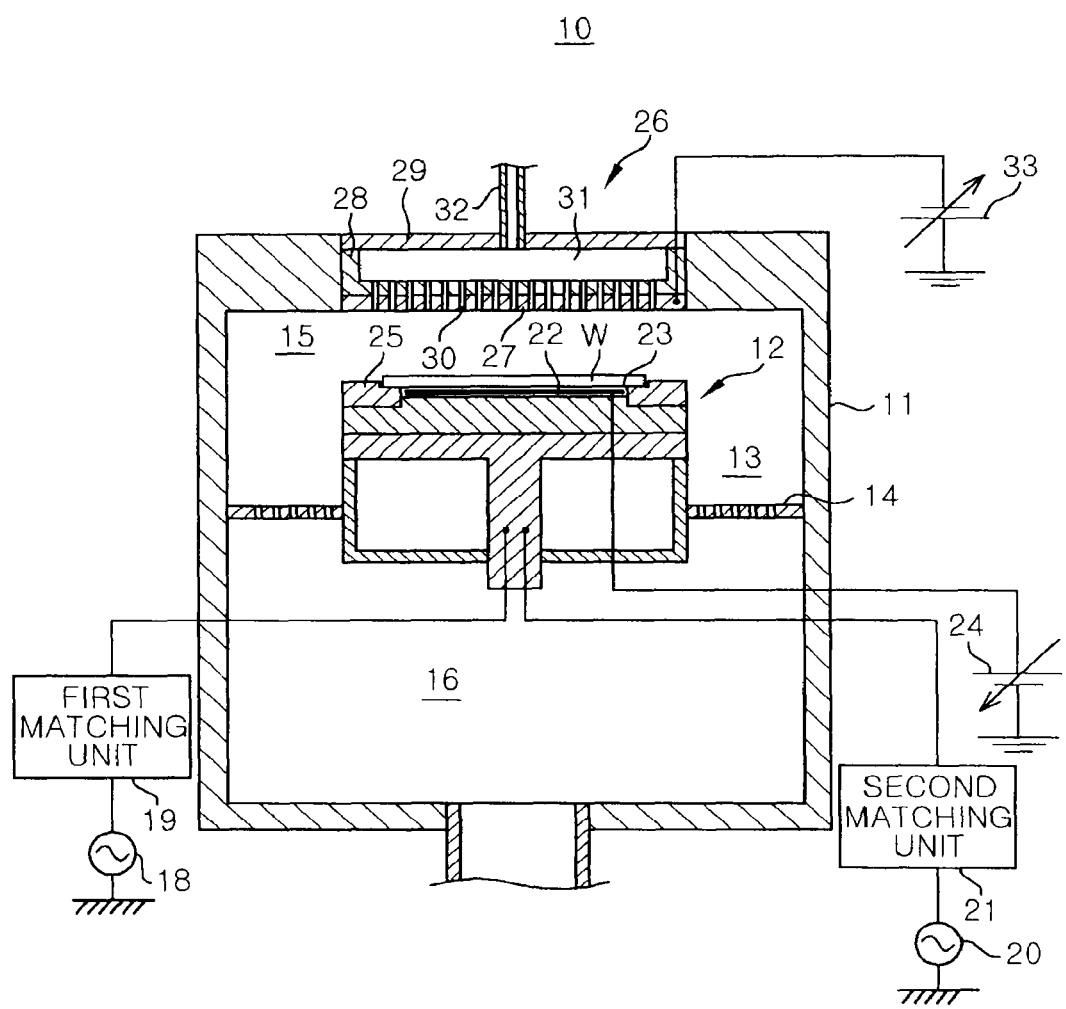
FIG. 1 schematically shows a configuration of a substrate processing apparatus for performing an etching processing method in accordance with a first embodiment of the present invention.

Embodiments of the present invention will be described with reference to the accompanying drawings which form a part hereof. Throughout the drawings, like reference numerals refer to like or similar parts, and redundant description thereof will be omitted.

First Embodiment

First, a substrate processing apparatus for performing an etching processing method in accordance with a first embodiment of the present invention will be described.

FIG. 1 schematically shows the configuration of the substrate processing apparatus for performing the etching processing method of the present embodiment. This substrate processing apparatus performs a plasma etching process on a wafer for a semiconductor device (hereinafter, referred simply to as "wafer") as a substrate.

Referring to FIG. 1, a substrate processing apparatus 10 includes a chamber 11 for accommodating therein a wafer W having a diameter of, e.g., about 300 mm, and a cylindrical susceptor 12 for mounting thereon the wafer W is disposed in the chamber 11. In the substrate processing apparatus 10, a side exhaust passageway 13 is defined by an inner sidewall of the chamber 11 and a side surface of the susceptor 12. A gas exhaust plate 14 is provided in the side exhaust passageway 13.

The gas exhaust plate 14 is a plate-shaped member having a plurality of through holes, and serves as a partition plate for partitioning the chamber 11 into an upper portion and a lower portion. In the upper portion (hereinafter, referred to as a "processing space") 15 of the chamber 11 partitioned by the gas exhaust plate 14, a plasma is generated as will be described later. The lower portion (hereinafter, referred to as a "gas exhaust space (manifold)") 16 of the chamber 11 is connected to a gas exhaust line 17 through which a gas is exhausted from the chamber 11. The gas exhaust plate 14 captures or reflects the plasma generated in the reaction chamber 15 to prevent the plasma from leaking into the manifold 16.

A TMP (Turbo Molecular Pump) and a DP (Dry Pump) (both not shown) are connected to the gas exhaust line 17, and reduce a pressure in the chamber 11 to a vacuum state. Moreover, the pressure in the chamber 11 is controlled by an APC (Automatic Pressure Control) valve (not shown).

The susceptor 12 in the chamber 11 is connected to a first high frequency power supply 18 via a first matching unit 19 and also connected to a second high frequency power supply 20 via a second matching unit 21. The first high frequency power supply 18 supplies to the susceptor 12 a high frequency power for plasma generation (first high frequency power) which has a relatively higher frequency, e.g., about 40 MHz. The second high frequency power supply 20 supplies to the susceptor 12 a high frequency power for ion attraction (second high frequency power) which has a relatively lower frequency, e.g., about 2 MHz. Accordingly, the susceptor 12 serves as an electrode. The first and the second matching unit 19 and 21 reduce reflection of the high frequency powers from the susceptor 12 to maximize the supply efficiency of the high frequency powers to the susceptor 12.

The upper portion of the susceptor 12 has a stepped shape in which a small-diameter circumferential portion coaxially protrudes from a leading end of a large-diameter circumferential portion. An electrostatic chuck 23 made of ceramic and having therein an electrostatic electrode plate 22 is disposed at a leading end of the small-diameter circumferential portion. The electrostatic electrode plate 22 is connected to a DC power supply 24. When a positive DC voltage is applied to the electrostatic electrode plate 22, a negative potential is generated on the surface (hereinafter, referred to as "back surface") of the wafer W which faces the electrostatic chuck 23. Accordingly, a potential difference is caused between the electrostatic electrode plate 22 and the back surface of the wafer W. The wafer W is attracted and held on the electrostatic chuck 23 by a Coulomb force or a Johnson-Rahbeck force generated due to the potential difference.

Further, a focus ring 25 is mounted on the stepped portion formed at the upper portion of the susceptor 12 so as to surround the wafer W attracted and held on the electrostatic chuck 23. The focus ring 25 is made of Si. In other words, since the focus ring 25 is formed of a semiconductor, the plasma distribution region is extended from a space above the wafer W to a space above the focus ring 25. Accordingly, the plasma density at the peripheral portion of the wafer W can be maintained at a level substantially equal to that at the central portion of the wafer W. This ensures the uniformity of the plasma etching processing on the entire surface of the wafer W.

A shower head 26 is provided at a ceiling portion of the chamber 11 so as to face the susceptor 12. The shower head 26 includes an upper electrode plate 27 made of, e.g., silicon, a cooling plate 28 detachably holding the upper electrode 27, and a cover 29 covering the cooling plate 28. The upper electrode plate 27 is made of a semiconductor, e.g., Si, and is formed of a circular plate-shaped member having a plurality of gas holes 30 extending therethrough in a thickness direction thereof. Moreover, a buffer space 31 is provided inside the cooling plate 28, and a processing gas inlet line 32 is connected to the buffer chamber 31. The processing gas inlet line 32 is also connected to a processing gas supply unit (not shown).

The processing gas supply unit produces a gaseous mixture by, e.g., controlling a flow rate ratio of various gases and introduces the gaseous mixture into the processing space 15 through the processing gas inlet line 32, the buffer chamber 31 and the gas holes 30.

Further, a second DC power supply 33 is connected to the upper electrode plate 27 of the shower head 26, and applies a negative DC power to the upper electrode plate 27. At this time, positive ions collide with the upper electrode 27, so that (secondary) electrons are emitted from the upper electrode plate 27, which results in improvement of the electron density distribution of the plasma in the processing space 15.

In the substrate processing apparatus 10, the processing gas introduced into the processing space 15 is excited into a plasma by the high frequency power for plasma generation which is applied from the first high frequency power supply 18 into the processing space 15 via the susceptor 12. The positive ions in the plasma are attracted toward the wafer W by the high frequency power for ion attraction which is supplied from the second high frequency power supply 20 to the susceptor 12, so that the wafer W is subjected to the plasma etching process.

However, in case a hole having a high aspect ratio of, e.g., about 30 or higher, is formed by the plasma etching process as described above, the deformation of the hole is not avoided even by using the technique described in Japanese Patent Application Publication No. 2007-134530.

Figure 2A:
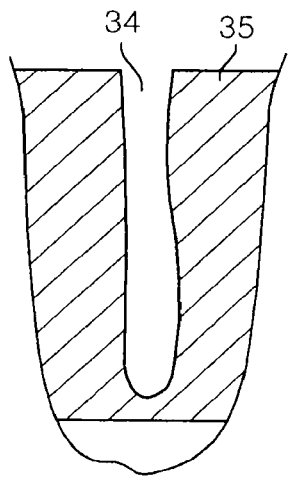
Figure 2B:
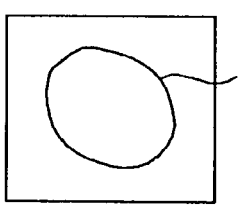
Figure 2C:
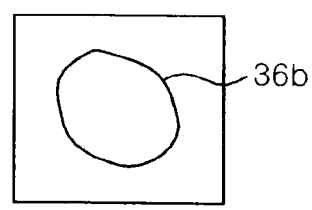
Figure 2D:
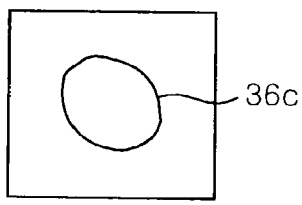
Figure 2E:
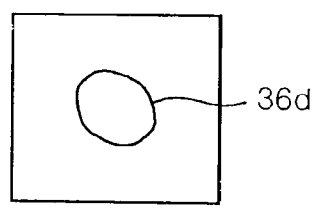

The present inventors have examined horizontal cross sections 36a to 36d of a deformed hole 34 shown in FIG. 2A which is formed by a conventional etching processing method at different depths of about 300 mm, 700 mm, 1500 mm and 2300 mm (respectively corresponding to aspect ratios of about 4, 9, 20 and 30) from the surface of the oxide film 35. As a result, it has been found that the hole 34 is deformed at a relatively shallow portion as well as near the bottom portion and also that the tendency of the deformation is the same in each of the horizontal cross sections 36a to 36d, as can be seen from FIGS. 2B to 2E.

Figure 2F:
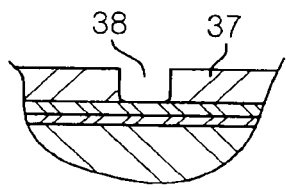
Figure 2G:
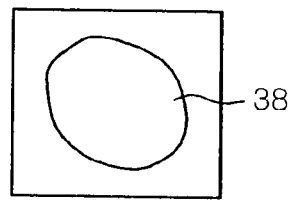

Further, the present inventors have examined a shape of a hole 38 shown in FIG. 2F which is formed in the mask film 37 on the oxide film 35 before the hole 34 is formed. As a result, it has been found that the hole 38 is deformed in the plane as shown in FIG. 2G and also that the tendency of the deformation is the same as those of the horizontal cross sections 36a to 36d.

From the above, the present inventors have concluded that the deformation of the hole 34 is caused mainly by the poor shape of the hole 38 and also that the deformation of the hole 38 in the mask film 37 affects the hole 34 when the hole 34 is formed in the oxide film 35 by plasma etching.

Based on the above conclusion, the etching processing method of the present embodiment is directed to prevent the deformation of the hole in the mask film before forming a hole in the oxide film.

Hereinafter, the etching processing method of the present embodiment will be described in detail.

Figure 3:
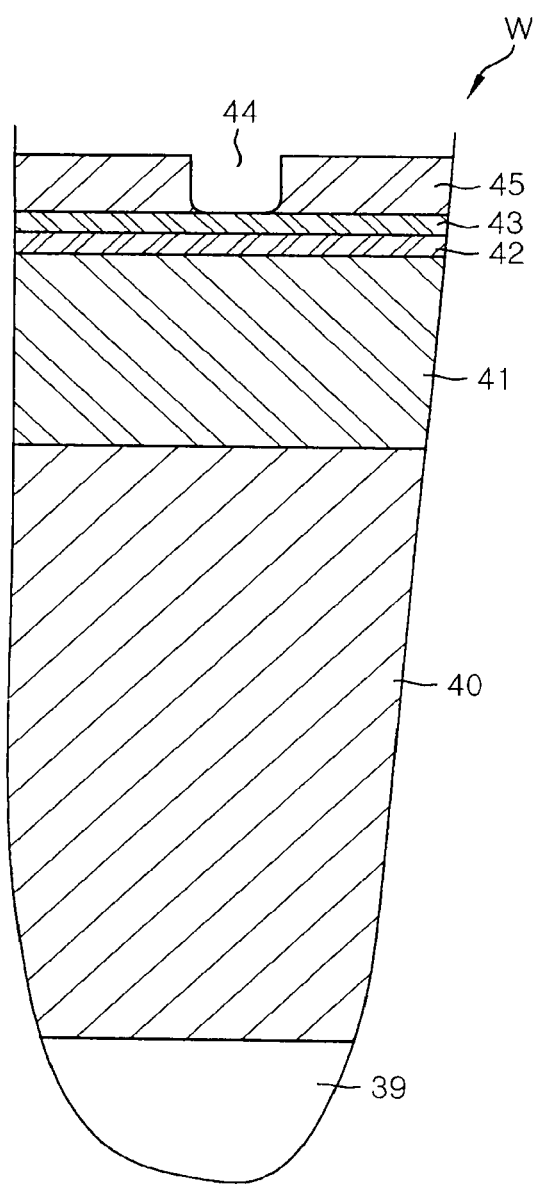
FIG. 3 is a cross sectional view schematically showing a structure of a part of a wafer processed by using the etching processing method of the first embodiment.

FIG. 3 is a cross sectional view schematically showing a structure of a part of the wafer processed by the etching processing method of the present embodiment.

Referring to FIG. 3, the wafer W includes a silicon portion 39 serving as a base portion; an $SiO_2$ film 40 (etching target film) formed on the silicon portion 39 and having a thickness of, e.g., about 2600 nm; a carbon film 41 formed on the $SiO_2$ film 40 and having a thickness of, e.g., about 900 nm; an SiON film 42 formed on the carbon film 41; a BARC film (bottom anti-reflection coating film) 43 formed on the SiON film 42; and a photoresist film 45 formed on the BARC film 43 and having a hole 44 (pattern) through which the BARC film 43 is exposed.

FIGS. 4A to 4D provide process flow diagrams of the etching processing method of the present embodiment.

Figure 4A:
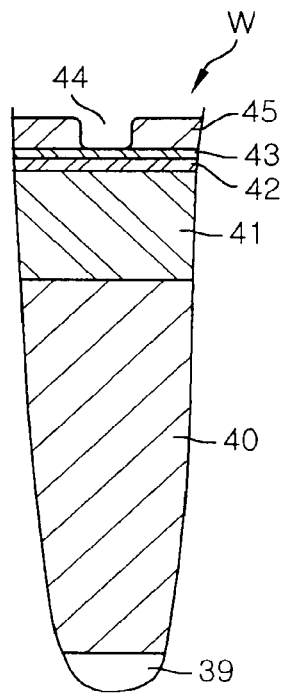
FIGS. 4A to 4D provide process flow diagrams of the etching processing method of the first embodiment.

First, the wafer W having the structure shown in FIG. 4A is mounted on the susceptor 12 in the chamber 11, and the wafer W is attracted and held by the electrostatic chuck 23.

Next, the pressure in the chamber 11 is reduced through the gas exhaust line 17 and set to, e.g., about 15 mTorr (1.96 Pa), through the APC valve. A gaseous mixture of CO gas having a flow rate, e.g., about 300 sccm, and Ar gas having a flow rate of, e.g., about 300 sccm, is introduced from the shower head 26 into the processing space 15. A high frequency power of, e.g., about 200 W, for plasma generation is applied into the processing space 15 without applying a DC power to the upper electrode plate 27. A high frequency power of, e.g., about 300 W, for ion attraction is applied to the susceptor 12 (pattern shape modification step).

Figure 5A:
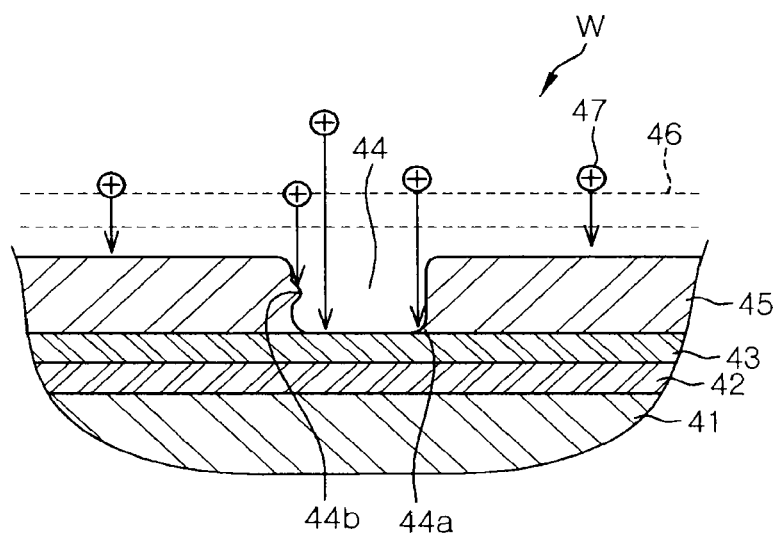

At this time, as shown in FIG. 5A, the gaseous mixture is excited into a plasma by the high frequency power supply for plasma generation, and a sheath 46 is formed on the surface of the wafer W by the high frequency power supply for ion attraction. The sheath 46 is a region having a low plasma particle density, especially a low electron density, which is generated by a difference in arrival speed of the positive ions and the electrons in the plasma. In the sheath 46, the positive ions are accelerated toward the wafer and the electrons are suppressed from moving toward the wafer.

Figure 5B:
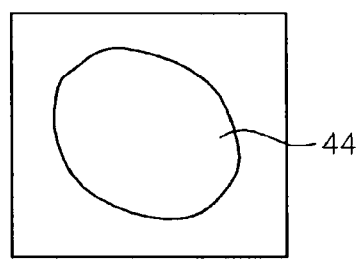
Figure 5C:
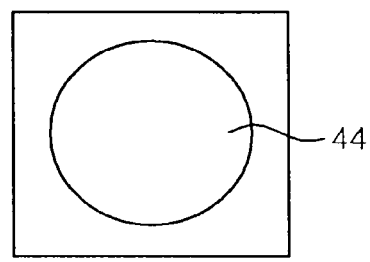

Since the output value of the high frequency power for ion attraction is relatively low, the formed sheath 46 is thin, and the positive ions 47 in the plasma are hardly accelerated. Hence, the photoresist film 45 is lightly sputtered by the positive ions 47. At this time, a foot portion 44a and a protrusion 44b of the hole 44 which mainly cause the deformation of the hole 44 are sputtered and removed preferentially. Moreover, the foot portion 44a and the protrusion 44b chemically react with the radicals in the plasma and, thus, the bottom portion 44a and the protrusion 44b are removed. As a result, the shape of the deformed hole 44 shown in FIG. 5B is modified and becomes a substantially round circle shown in FIG. 5C.

When the shape of the hole 44 is modified, any gas selected from, e.g., $O_2$ gas, $CO_2$ gas, $H_2/N_2$ gas and $NH_3$ gas, may be added, instead of CO gas, to the gaseous mixture. Alternatively, $O_2$ gas may be further added thereto if necessary.

Besides, the pressure in the chamber 11, the output value of the high frequency power for plasma generation, the output value of the high frequency power for ion attraction, and the flow rate of the gaseous mixture may be changed if necessary. For example, instead of the above-described gaseous mixture, a gaseous mixture of $O_2$ gas having a flow rate of, e.g., about 5 sccm, COS gas having a flow rate of, e.g., about 10 sccm, and Ar gas having a flow rate of, e.g., about 300 sccm, may be introduced into the processing space 15.

If necessary, the DC power may be applied to the upper electrode plate 27. In that case, the electron density distribution of the plasma in the processing space 15 is improved, so that the shape of the hole 44 can be substantially uniformly modified over the entire surface of the wafer W.

In order to modify the hole 44 more reliably, the photoresist film 45 is etched until the diameter of the hole 44 becomes larger than a desired diameter, and the film thickness of the photoresist film 45 is reduced. Accordingly, when a hole 51 to be described late is formed in the $SiO_2$ film 40 by plasma etching, the photoresist film 45 may be eroded and removed before the depth of the hole 51 reaches a desired level.

Figure 4B:
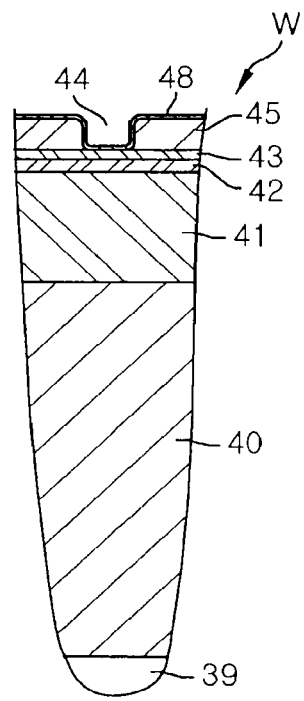

For that reason, in the etching processing method of the present embodiment, after the shape of the hole 44 is modified, the photoresist film 45, the BARC film 43, the SiON film 42 and the carbon film 41 are hardened before the hole 51 is formed on the $SiO_2$ film. For example, a hardened layer 48 is formed on the surface of the photoresist film 45 and the exposed surface of the BARC film, as shown in FIG. 4B.

In the present embodiment, after the shape of the hole 44 is modified, the pressure in the chamber 11 is set to, e.g., about 50 mTorr (6.67 Pa) by the APC valve, and a gaseous mixture of $H_2$ gas having a flow rate of, e.g., about 100 sccm, $CF_4$ gas having a flow rate of, e.g., about 40 sccm, and Ar gas having a flow rate of, e.g., about 800 sccm, is introduced into the processing space 15. Further, a DC power of, e.g., about −900 V, is applied to the upper electrode plate 27. Moreover, a high frequency power of, e.g., about 300 W, for plasma generation is applied into the processing space 15, while a high frequency power for ion attraction is not applied to the susceptor 12 (mask film hardening step).

Figure 6A:
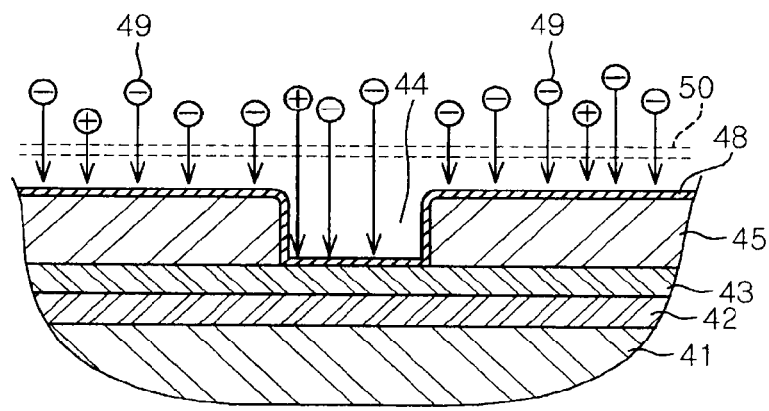

At this time, as shown in FIG. 6A, the plasma is generated from the gaseous mixture, and electrons 49 are emitted from the electrode plate 27, which leads to the increase in the electron density in the processing space 15. Further, a self bias voltage is generated on the wafer W by the high frequency power for plasma generation, and a sheath 50 is generated above the surface of the wafer W by the self bias voltage. The sheath 50 is extremely thin and hardly hinders the movement of the electrons 49 toward the wafer W. Thus, the electrons 49 in the processing space 15 reach the photoresist film 45 and the BARC film 43 exposed via the hole 44 and contact therewith.

In general, the organic-based film is hardened when it contacts with electrons. Therefore, the hardened layer 48 is formed on the surface of the photoresist film 45 and the BARC film 43. Furthermore, the electrons 49 contacting with the photoresist film 45 are doped into the photoresist film 45 to the films formed thereunder such as the BARC film 43, the SiON film 42 and the carbon film 41. As a consequence, those films are hardened.

Figure 6B:
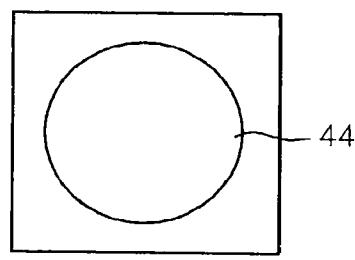
Figure 6C:
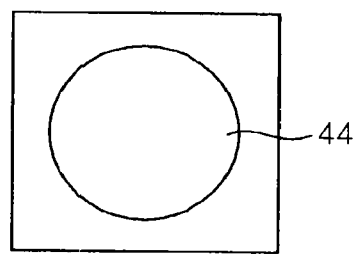

Since $CF_4$ gas is a depositive gas, a plasma of $CF_4$ gas produces deposits by the reaction with the photoresist film 45. The deposits are adhered onto the surfaces of the photoresist film 45 and the BARC film 43, especially onto the inner surface of the hole 44. Accordingly, the hole 44 having an increased diameter shown in FIG. 6B can be modified to the hole 44 having a desired diameter shown in FIG. 6C.

When the photoresist film 45 and the like are hardened, a gaseous mixture of $H_2$ gas and Ar gas, a gaseous mixture of $H_2$ gas, COS gas and Ar gas, or a gaseous mixture of $CF_4$ gas and Ar gas, and COS gas, for example, may be used instead of the aforementioned gaseous mixture of $H_2$ gas, $CF_4$ gas and Ar gas.

Further, the pressure in the chamber 11, the output values of the DC power and the high frequency power for plasma generation, and the flow rate of the gaseous mixture may be changed if necessary. For example, a DC power of about −900 V or less may be applied to the upper electrode plate 27. In that case, the amount of electrons emitted from the upper electrode plate 27 can be increased, and an absolute value of the potential difference between the wafer W and the upper electrode plate 27 which is greater than a predetermined value can be obtained. As a result, the number of electrons that reach and contact with the photoresist film 45 or the BARC film 43 can be increased.

In the etching processing method of the present embodiment, the shape modification of the hole 44 and the hardening of the photoresist film 45 and the like are performed once respectively.

Figure 4C:
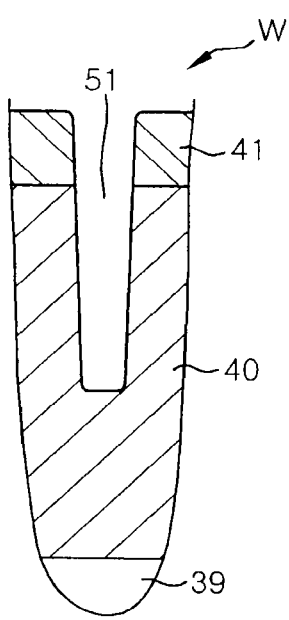

After the photoresist film 45 and the like are hardened, a hole 51 to be described later is formed in the $SiO_2$ film 40 by plasma etching, as can be seen from FIG. 4C.

In the present embodiment, upon completion of the hardening of the photoresist film 45 and the like, the pressure in the chamber 11 is set to, e.g., about 30 mTorr (4.00 Pa), by the APC valve, and a gaseous mixture of $C_4F_6$ gas having a flow rate of, e.g., about 32 sccm, $C_4F_8$ gas having a flow rate of, e.g., about 16 sccm, $CF_4$ gas having a flow rate of, e.g., about 24 sccm, Ar gas having a flow rate of, e.g., 600 sccm, and $O_2$ gas having a flow rate of, e.g., about 36 sccm, is introduced into the processing space 15. Moreover, a DC power of, e.g., about −300 V, is applied to the upper electrode plate 27. Further, a high frequency power of, e.g., about 2200 W, for plasma generation is applied into the processing space 15, and a high frequency power of, e.g., about 7800 W, for ion attraction is applied to the susceptor 12 (target film etching step).

At this time, as shown in FIG. 7A, a plasma is generated from the gaseous mixture, and electrons 53 are emitted from the upper electrode plate 27. Further, a self bias voltage is generated on the wafer W by the high output of the high frequency power for ion attraction, and a sheath 52 is formed on the surface of the wafer W by the self bias voltage. The sheath 52 is extremely thick and thus hinders the movement of the electrons 53 toward the wafer W while accelerating the positive ions 54 in the plasma. Therefore, the bottom portion of the hole 44 is strongly sputtered by the positive ions 54. Especially, the BARC film 43, the SiON film 42 and the carbon film 41 inside the hole 44 are etched and, then, the exposed $SiO_2$ film 40 is etched.

When the $SiO_2$ film 40 is etched, a gaseous mixture of $C_4F_6$ gas, Ar gas and $O_2$ gas, a gaseous mixture of $C_4F_8$ gas, Ar gas and $O_2$ gas, or a gaseous mixture of $C_4F_6$ gas, $C_4F_8$ gas, Ar gas and $O_2$ gas, for example, may be used instead of the aforementioned gaseous mixture of $C_4F_6$ gas, $C_4F_8$ gas, $CF_4$ gas, Ar gas and $O_2$ gas. If necessary, $CF_4$ gas, $C_3F_8$ gas or COS gas may be added thereto.

Furthermore, the pressure in the chamber 11, the output value of the DC power, the output value of the high frequency power for plasma generation, the output value of the high frequency power for ion attraction, and the flow rate of the gaseous mixture may be changed if necessary. For example, the pressure in the chamber 11 may be set to, e.g., about 20 mTorr (2.67 Pa). A gaseous mixture of $C_4F_6$ gas having a flow rate of, e.g., about 50 sccm, $C_4F_8$ gas having a flow rate of about 20 sccm, Ar gas having a flow rate of, e.g., about 200 sccm, and $O_2$ gas having a flow rate of, e.g., about 55 sccm, may be introduced into the processing space 15. Further, a DC power of, e.g., −300 V, may be applied to the upper electrode plate 27. Moreover, a high frequency power of, e.g., about 1000 W, for plasma generation may be applied to the processing space 15, and a high frequency power of, e.g., about 7800 W, for ion attraction may be applied to the susceptor 12.

In the present embodiment, the photoresist film 45 is strongly sputtered by the positive ions 54. Since, however, the photoresist film 45 is hardened, the photoresist film 45 is not immediately removed. Even if the photoresist film 45 is removed, the BARC film 43, the SiON film 42 and the carbon film 41 that have been formed under the photoresist film 45 are hardened and, thus, the films are not immediately removed. Accordingly, the selectivity of the photoresist film 45 and the like to the $SiO_2$ film 40 is maintained, and the photoresist film 45 and the like can serve as the mask film for a predetermined period of time. As a result, a hole 51 is formed in the $SiO_2$ film 40 so as to correspond to the hole 44.

When the depth of the hole 51 is increased by etching the $SiO_2$ film 40, the positive ions 54 that have been accelerated by the sheath 52 and introduced into the hole 51 remain at the bottom portion of the hole 51. In the etching processing method of the present embodiment, in order to electrically neutralize the remaining positive ions 54, the electrons 53 are actively introduced into the bottom portion of the hole 51.

Specifically, the high frequency power for ion attraction and the high frequency power for plasma generation are applied in a pulse wave form (target film etching step). More specifically, a first period during which the high frequency power for ion attraction and the high frequency for plasma generation are applied together and a second period during which the high frequency power for ion attraction and the high frequency power for plasma generation are not applied together are controlled to be repeated alternately at a regular interval.

In other words, the high frequency power for plasma generation supplied from the first high frequency power supply 18 is modulated and applied to the susceptor 12, and the high frequency power for ion attraction supplied from the second high frequency power supply 20 is modulated at a timing same as that of modulating the high frequency power for plasma generation and then applied to the susceptor 12. As a typical example of the modulation of the power to be applied, the pulse form modulation shown in FIG. 13A is taken.

Figure 13A:
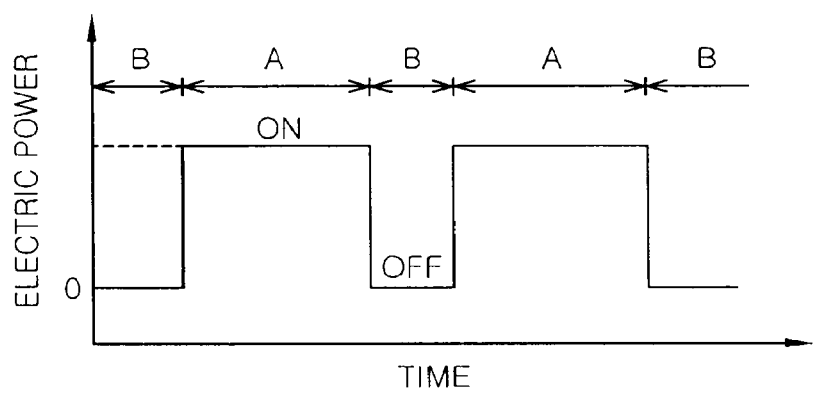
Figure 13B:
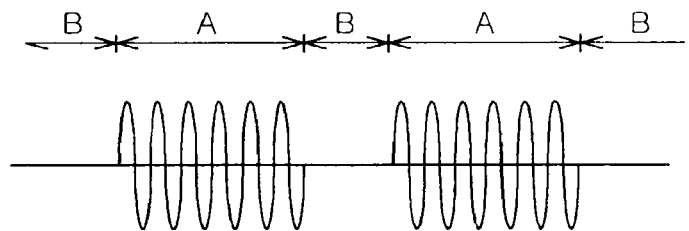

FIG. 13A representatively shows the modulation state of the high frequency power for ion attraction. In FIG. 13A, a period "A" indicates a period during which the high frequency power for ion attraction is applied, and a period "B" indicates a period during which the high frequency power for ion attraction is not applied. In this typical example, the high frequency power for ion attraction is repeatedly turned ON and OFF. The waveform of the high frequency power for ion attraction in this case is shown in FIG. 13B.

Figure 8:
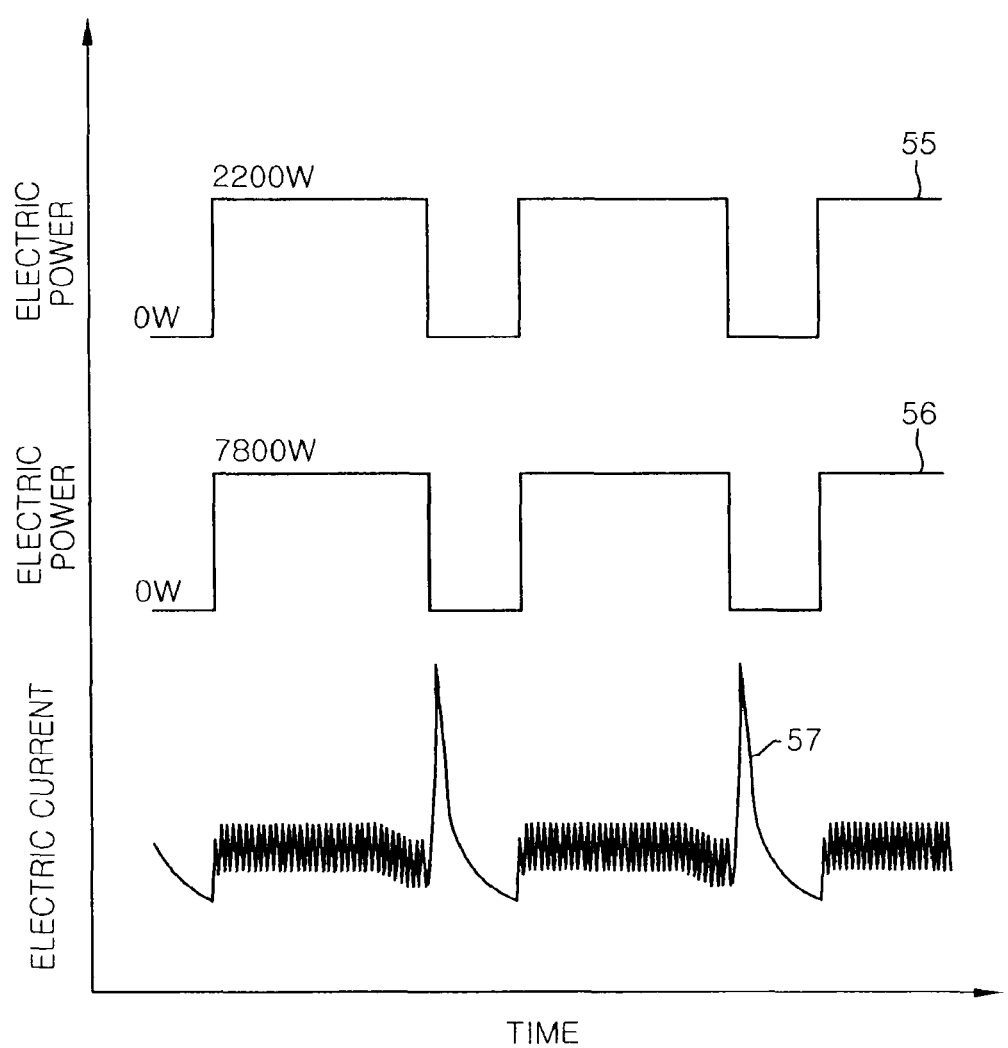
FIG. 8 explains a high frequency power for plasma generation, a high frequency power for ion attraction, and a current flowing near the surface of the wafer in accordance with the etching processing method of the first embodiment.

FIG. 8 shows relationship among the high frequency power for plasma generation, the high frequency power for ion attraction, and the current flowing near the surface of the wafer. In FIG. 8, the X-axis indicates time, and the Y-axis indicates a power value or a current value.

Referring to FIG. 8, when a plasma generating high frequency power 55 and the ion attracting high frequency power 56 are synchronously applied in a pulse wave form, the state in which the output values of the ion attracting high frequency power 56 and the plasma generating high frequency power 55 become zero, and the ion attracting high frequency power 56 and the plasma generating high frequency power 55 are not applied is obtained.

When the ion attracting high frequency power 56 and the plasma generating high frequency power 55 are not applied, the sheath 52 is extinguished as shown in FIG. 7B. At this time, a DC power of a negative potential is constantly applied to the upper electrode plate 27, so that the electrons 53 generated by the incidence of positive ions to the upper electrode plate 27 are accelerated by the negative DC voltage applied to the upper electrode plate 27 and enter the hole 51 at a high speed without being disturbed by the sheath 52. Accordingly, the positive ions 54 remaining at the bottom portion of the hole 51 are electrically neutralized.

Here, the flow of the electrons introduced into the bottom portion of the hole 51 is observed as a current flowing near the surface of the wafer. As shown in FIG. 8, the current 57 flowing near the surface of the wafer W flows in a spike pattern instantly when a short period of time, e.g., about 5 μsec, elapses after the output values of the ion attracting high frequency power 56 and the plasma generating high frequency power 55 become zero and, then, the value of the current 57 is decreased quickly.

The reason that the current 57 flows when about 5 μsec elapses after the output values of the ion attracting high frequency power 56 and the like become zero is because about 5 μsec is required until the electron temperature is sufficiently decreased and the sheath 52 is extinguished after the output values of the ion attracting high frequency power 56 and the like become zero. Meanwhile, the reason that the value of the current 57 is decreased quickly after the current 57 flows in a spike pattern instantly is considered due to the rapid decrease in the density of the positive ions required for generation of the electrons 53 emitted from the upper electrode plate 27.

Therefore, in order to electrically neutralize the remaining positive ions 54 by introducing a certain amount of electrons 53 into the bottom portion of the hole 51, it is preferable to maintain for at least about 5 μsec the state in which the output values of the ion attracting high frequency power 56 and the like become zero, i.e., the state in which the ion attracting high frequency power 56 and the like are not applied.

Hence, it is unnecessary to keep for a long period of time the state in which the output values of the plasma generating high frequency power 55 and the ion attracting high frequency power 56 applied in a pulse wave form become zero. In other words, the duty ratio of the plasma generating high frequency power 55 and the ion attracting high frequency power 56 may be set to a high level. Specifically, the duty ratio thereof may be set between about 10% and 90%, and preferably set between about 50% and 90%. In that case, the maximum level of the duty ratio is about 90%, so that the state in which the ion attracting high frequency power 56 and the like are not applied can be obtained, which makes it possible to reliably introduce the electrons 53 into the bottom portion of the hole 51.

When the ion attracting high frequency 56 is not applied, the sheath 52 is extinguished and, thus, the sputtering of the positive ions 54 is lowered and the etching efficiency of the $SiO_2$ film is decreased. Further, the minimum level of the duty ratio is about 50%, so that it is possible to avoid the state in which the sheath 52 is extinguished and prevent the decrease of the etching efficiency of the $SiO_2$ film. In the etching processing method of the present embodiment, the duty ratio is set to about 70%.

The electrons 53 are more frequently introduced into the bottom portion of the hole 51 as the frequencies of the pulse waves (pulse frequencies) of the plasma generating high frequency power 55 and the ion attracting high frequency power 56 become higher. Thus, the higher frequency is preferably used. Meanwhile, if the corresponding frequencies are excessively high, it is difficult to maintain the state in which the ion attracting high frequency power 56 and the like are not applied for at least a period of time required for extinguishing the sheath 52.

Hence, the frequencies of the pulse waves of the plasma generating high frequency power 55 and the ion attracting high frequency power 56 may range from about 1 KHz to 50 KHz and may preferably range from about 10 KHz to 50 KHz. In the etching processing method of the present embodiment, the frequency of the pulse wave is set to about 10 KHz.

In the etching processing method of the present embodiment, a DC power of a negative potential is constantly applied to the upper electrode plate 27 even when the ion attracting high frequency power 56 and the like are not applied, so that the upper electrode plate 27 has a negative potential. Meanwhile, if the ion attracting high frequency power 56 is not applied to the susceptor 12, a bias voltage is hardly generated on the wafer W and, thus, the potential near the wafer W becomes substantially zero. Accordingly, the absolute value of the potential difference between the wafer W and the upper electrode plate 27 which is equal to or greater than a predetermined value can be obtained.

In addition, since the electrons 53 are attracted toward the wafer W by the potential difference, the introduction of the electrons 53 into the bottom portion of the hole 51 can be facilitated. Further, the electrons 53 can be constantly emitted from the upper electrode plate 27 by constantly applying a DC power of a negative potential to the upper electrode plate 27, which can lead to the increase in the electron density in the processing space 15. As a result, the probability that the electrons 53 are introduced into the bottom portion of the hole 51 can be increased.

In the etching processing method of the present embodiment, the output values of the ion attracting high frequency power 56 and the like are set to zero when the electrons 53 are introduced into the bottom portion of the hole 51. However, if the absolute value of the potential difference between the wafer W and the upper electrode plate 27 which is greater than or equal to the predetermined value can be obtained, the electrons 53 can be attracted toward the wafer W, which makes it unnecessary to set the output values of the ion attracting high frequency power 56 and the like to zero. For example, when a DC power of about −300 V is applied to the upper electrode plate 27, the ion attraction high frequency power 56 may be set such that a bias voltage generated on the wafer W becomes higher than about −300 V.

Figure 4D:
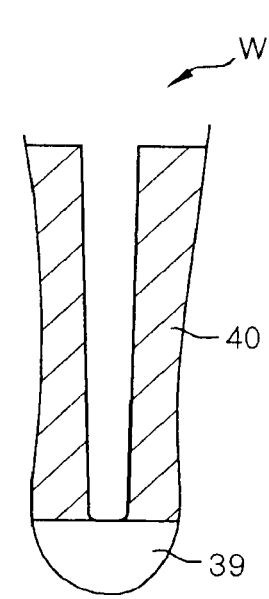

Next, the plasma generating high frequency power 55 and the ion attracting high frequency power 56 are continuously applied in the pulse wave form. Accordingly, the carbon film 41 is removed as shown in FIG. 4D, and a hole 51 having an aspect ratio of about 30 or higher is formed in the $SiO_2$ film 40. When the silicon portion 39 is exposed to the bottom portion of the hole 51, the etching processing method of the present embodiment is completed.

In accordance with the etching processing method of the present embodiment, the shape of the hole 44 formed in the photoresist film 45 is modified, so that it is possible to prevent the shape of the hole 51 formed in the $SiO_2$ film 40 from being affected by the poor shape (deformation or the like) of the hole 44 formed in the photoresist film 45.

Further, the photoresist film 45 and the like are hardened by the electrons 49, so that the photoresist film 45 can be prevented from being removed quickly during the plasma etching of the $SiO_2$ film 40. As a consequence, the hole 51 can be reliably formed in the $SiO_2$ film 40.

When the $SiO_2$ film 40 is etched by the plasma, a DC power of a negative potential is applied to the upper electrode plate 27, and the ion attracting high frequency power 56 is applied in the form of a pulse wave to the susceptor 12, which allows the state in which the ion attracting high frequency power 56 is not applied to the susceptor 12. Therefore, a large amount of electrons 53 can be generated, and the sheath 52 on the surface of the wafer W can be extinguished. Hence, the electrons 53 can be reliably introduced into the bottom portion of the hole 51 formed in the $SiO_2$ film 40.

As a result, even if the formed hole 51 has a high aspect ratio, it is possible to prevent the swelling of the side portion of the hole 51 or the deformation of the hole 51.

In the etching processing method of the present embodiment, when the $SiO_2$ film 40 is etched by the plasma, the plasma generating high frequency power 55 is also applied in the form of a pulse wave, which allows the state in which the plasma preventing high frequency power 55 is not applied into the processing space 15. Thus, the sheath 52 can be reliably extinguished.

In the etching processing method of the present embodiment, the plasma generating high frequency power 55 and the ion attracting high frequency power 56 are synchronously applied in a pulse wave form. Hence, it is possible to obtain the state in which the plasma generating high frequency power 55 and the ion attracting high frequency power 56 are not applied together. Accordingly, the sheath 52 can be reliably extinguished.

Figures 14A, 14B:
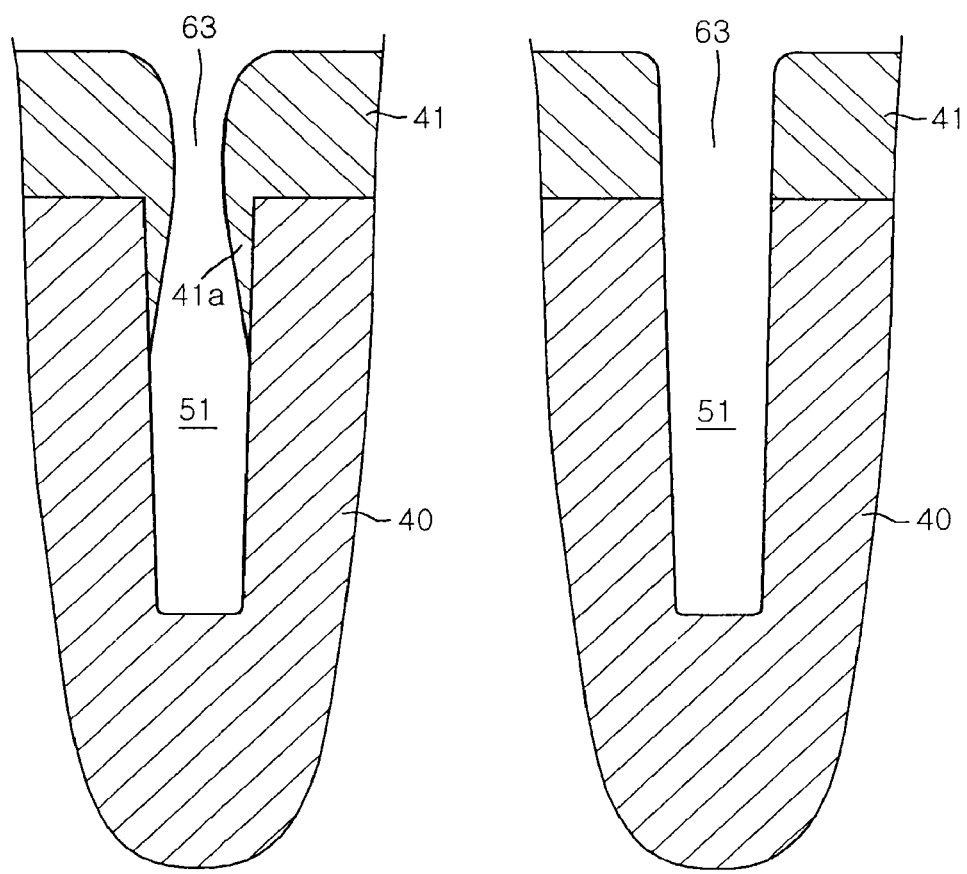

If the plasma generating high frequency power 55 and the ion attracting high frequency power 56 are continuously applied (hereinafter, referred to as a "the case of continuous application"), the deposits are adhered onto the carbon film 41 in an entrance width 63 of the hole 51 as shown in FIG. 14A. As a consequence, the protrusion 41a is formed and the width 63 is reduced.

Meanwhile, when the plasma generating high frequency power 55 and the ion attracting high frequency power 56 are synchronously applied in a pulse wave form (hereinafter, referred to as a "the case of pulse wave form application"), the protrusion 41a is not formed as shown in FIG. 14B and the width 63 is not reduced.

The present inventors have performed various examinations to verify the above phenomenons and have found that the density and the temperature of the electrons produced in the processing space 15 is varied depending on whether or not the plasma generating high frequency power 55 and the ion attracting high frequency power 56 are synchronously applied.

Specifically, as shown in FIG. 15, in the case of the continuous application, the electron density is maintained at a high level without being varied. On the other hand, in the case of the pulse wave form application, the electron density is decreased when the ion attracting high frequency power 56 and the like are not applied. Moreover, the present inventors have found that as the duty ratio is decreased, the period of time in which the electron density is decreased is increased.

Figure 16:
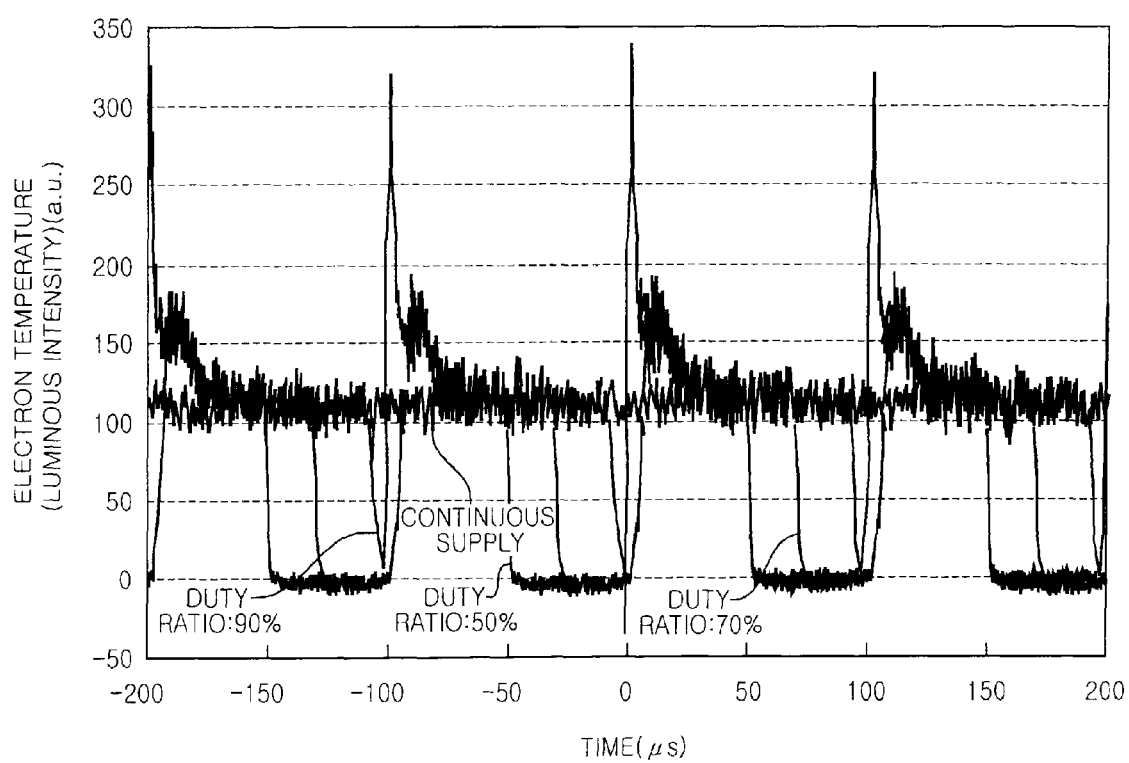
FIG. 16 explains variations in an electron temperature in the processing space in the case of continuous application and pulse wave form application.

Further, as shown in FIG. 16, in the case of the continuous application, the electron temperature (more specifically, luminous intensity obtained when Ar gas in the gaseous mixture is excited) is maintained at a substantially constant level without being varied. However, in the case of the pulse wave form application, the electron temperature is increased instantly and decreased compared to that in the continuous application for a period of time which is increased as the duty ratio is decreased. In other words, it is considered that the electron density and the electron temperature in the case of the pulse wave form application are averagely lower than those in the continuous application in terms of time.

When the electron density and the electron temperature are decreased, the gaseous mixture is not dissociated into radicals, and the degree of dissociation is decreased. When the dissociation degree is decreased, the attachment coefficient of radicals is increased. Here, the attachment coefficient of radicals is an index indicating a degree to which it is easy for radicals to be attached to a certain layer in the case where the radicals collide with the certain layer.

When the attachment coefficient is increased, the radicals are easily attached to the certain layer. Further, the reason that the decrease in the dissociation degree leads to the increase in the attachment coefficient of the radicals is because the low dissociation degree indicates that the radicals have low energy and that the radicals having low energy easily lose energy by colliding with the certain layer several times and are apt to remain in situ.

Figure 17A:
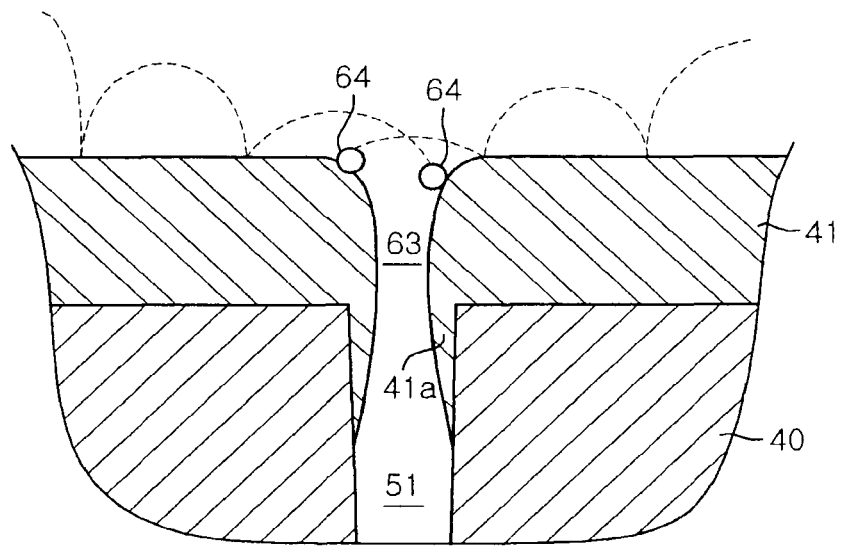

In other words, in the case of the continuous application, the electron density and the electron temperature are increased, so that the dissociation degree is increased while the attachment coefficient is decreased. As a result, as shown in FIG. 17A, the radicals generated from the gaseous mixture, especially CF-based radicals 64, lose only a small amount of energy despite the collision with the surface of the carbon film 41. Therefore, the radicals 64 are not adhered onto the surface of the carbon film 41. When the radicals 64 reach the width 63, the radicals 64 lose energy while bouncing from the carbon film 41 and then are adhered as deposits onto the carbon film 41 near the width 63. Hence, the width 63 is reduced.

Figure 17B:
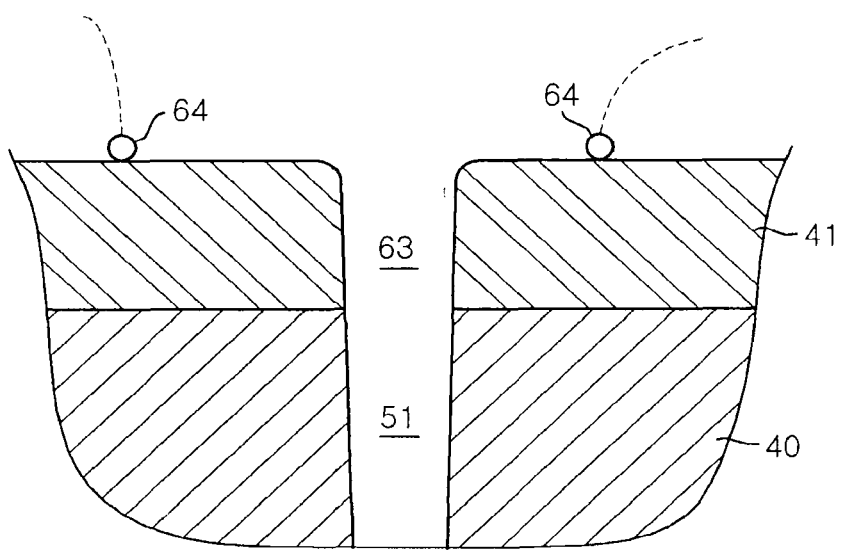

Meanwhile, in the case of the pulse wave form application, the electron density and the electron temperature are low, so that the dissociation degree is decreased while the attachment coefficient is increased. As a result, as shown in FIG. 17B, the CF-based radicals 64 generated from the gaseous mixture easily lose the energy by the collision with the surface of the carbon film 41 and then are adhered onto the surface of the carbon film 41. Thus, the radical 64 do not reach the width 63, and the width 63 is not reduced.

In other words, in the etching processing method of the present embodiment, the plasma generating high frequency power 55 and the ion attracting high frequency power 56 are synchronously applied in a pulse wave form, so that the attachment coefficient of the radicals 64 generated from the gaseous mixture is increased, and the radicals 64 are adhered onto the surface of the carbon film 41 without reaching the width 63. As a result, the width 63 is not reduced, and the positive ions 54 can effectively enter the hole 51. In addition, the path of the positive ions 54 can be prevented from being changed by the collision with the protrusion 41a. Accordingly, the swelling of the side portion of the hole 51 or the deformation of the hole 51 can be reliably prevented.

As the attachment coefficient of the radical 64 is increased, the possibility in which the width 63 is reduced is decreased. Therefore, the higher attachment coefficient of the radicals 64 is preferable. Since, however, a high level CF-based gas, e.g., $C_4F_6$ gas or $C_4F_8$ gas, generally has a high attachment coefficient of CF-based radicals compared to a low level CF-based gas, e.g., $CF_2$ gas or $CF_4$ gas, $C_4F_6$ gas or $C_4F_8$ gas is preferably used as a CF-based gas in a gaseous mixture. The attachment coefficient of $C_4F_6$ gas or $C_4F_8$ gas ranges between about 0.1 and 0.01, and that of $CF_2$ gas or $CF_4$ gas ranges between about 0.01 and 0.0001.

In the case of the pulse wave form application, as the duty ratio is decreased, the electron density and the electron temperature are decreased and, thus, the attachment coefficient of the CF-based radicals is increased. Accordingly, the lower duty ratio is preferable. For example, the duty ratio may be about 70% or less, and preferably about 50% or less. Accordingly, the possibility in which the width 63 is reduced can be decreased.

In the etching processing method of the above-described embodiment, when the hole 51 is formed by the plasma etching, the gaseous mixture of $C_4F_6$ gas, $C_4F_8$ gas, $CF_4$ gas, Ar gas and $O_2$ gas is introduced into the processing space 15, and turned into a plasma. However, as for a rare gas, He gas may be added thereto instead of Ar gas.

When the positive ions of the Ar gas collide with the upper electrode plate 27, secondary electrons are emitted from the upper electrode plate 27. However, when the positive ions of He gas collide with into the upper electrode plate 27 made of silicon, a larger amount of secondary electrons are emitted from the upper electrode plate 27. Specifically, a secondary electron emission coefficient obtained in the case of colliding He positive ions against silicon is about 0.172, and a secondary electron emission coefficient obtained in the case of colliding Ar positive ions against silicon is about 0.024.

Therefore, the amount of secondary electrons emitted from the upper electrode plate 27 can be increased by adding He gas instead of Ar gas. As a result, when the hole 51 is formed, the number of electrons 53 entering the hole 51 can be increased during the second period during which the high frequency power for ion attraction and the high frequency power for plasma generation are not applied together, and the electrical neutralization of the positive ions 54 remaining at the bottom portion of the hole 51 can be reliably carried out.

The present inventors have found that the electron temperature measured when He gas is excited is higher than that measured when Ar gas is excited. Thus, when He gas is mixed with the gaseous mixture, the dissociation degree is increased considerably, and the attachment coefficient of radicals is decreased remarkably.

Figure 18:
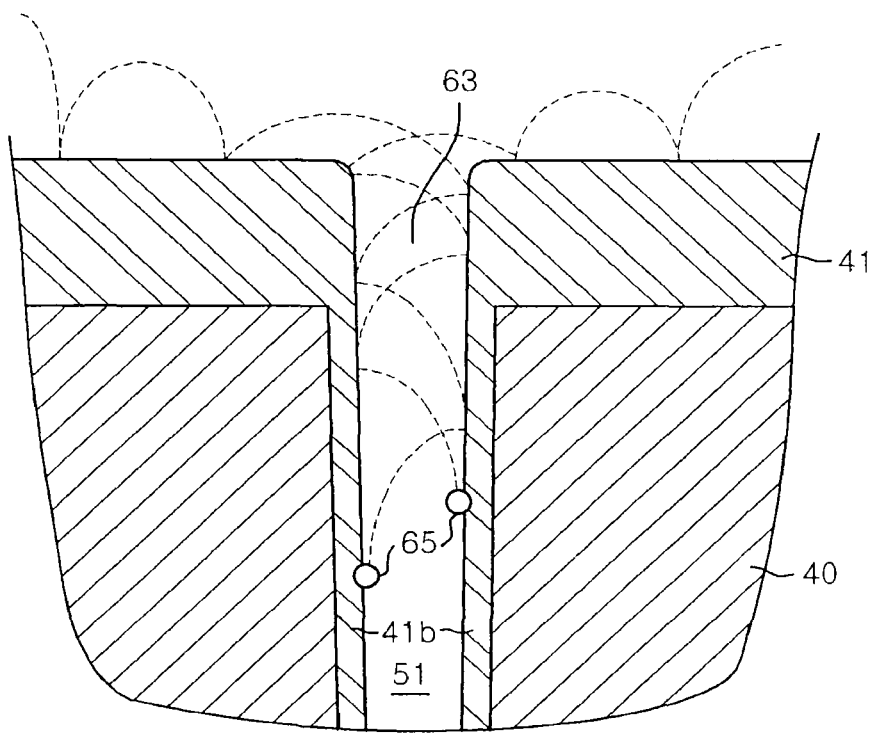
FIG. 18 explains an adhesion shape of radicals in the case of using a gaseous mixture containing He gas as a rare gas in the continuous application.

When the attachment coefficient of radicals is decreased remarkably, radicals 65 lose only a small amount of energy despite repeated collision with the surface of the carbon film 41 and thus are not adhered onto the surface of the carbon film 41 as shown in FIG. 18. Even when the radicals 65 reach the width 63, they do not lose the energy and thus are not adhered as deposits onto the carbon film 41 near the width 63. Instead, the radicals 65 move toward the bottom portion of the hole 51.

Thereafter, the radical 65 lose the energy by repeated collision with the sidewall of the hole 51 and then are adhered as deposits onto the sidewall of the hole 51, thereby forming a deposit thin film 41b. In other words, the width 63 is not reduced and, thus, the path of the positive ions 54 is prevented from being changed by the collision with the protrusion 41a.

Besides, the mass of He positive ions is considerably smaller than that of Ar positive ions, so that the sidewall of the hole 51 is not etched despite the collision with the He positive ions.

As a result, the swelling of the side portion of the hole 51 or the deformation of the hole 51 can be prevented.

Second Embodiment

Hereinafter, an etching processing method in accordance with a second embodiment of the present invention will be described in detail.

The configuration and the operation of the second embodiment are basically the same as those of the first embodiment. Therefore, the description of the same configuration and operation will be omitted, and only the difference will be explained.

Figure 9:
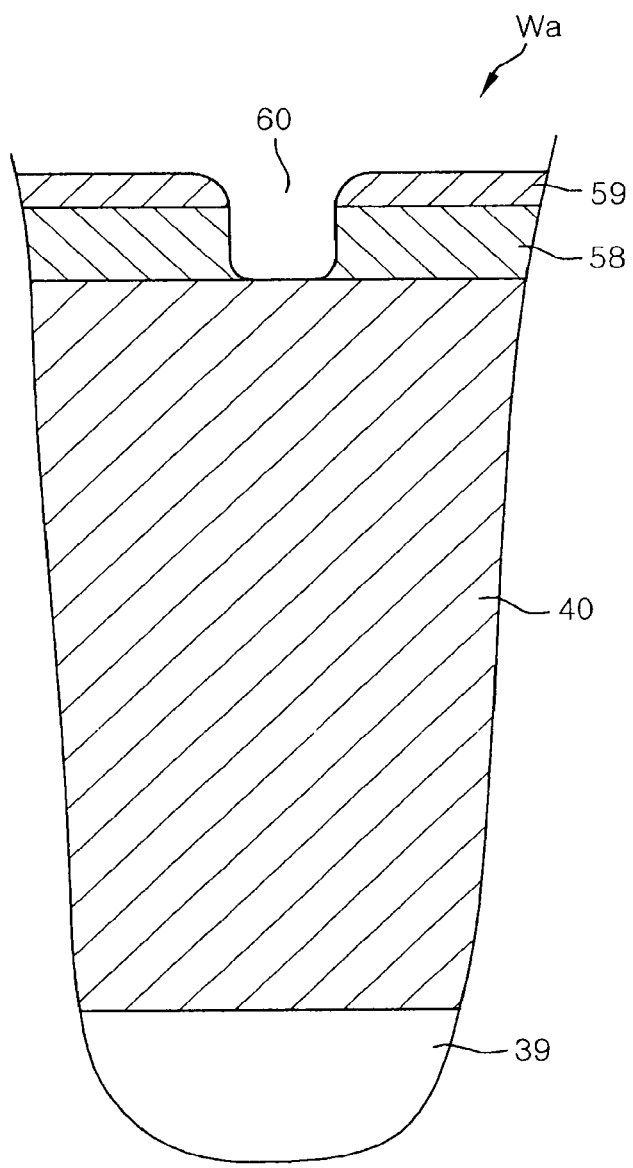
FIG. 9 is a cross sectional view schematically showing a structure of a part of a wafer processed by using an etching processing method in accordance with a second embodiment of the present invention.

FIG. 9 is a cross sectional view schematically showing a structure of a part of a wafer processed by the etching processing method of the present embodiment.

Referring to FIG. 9, a wafer Wa includes a silicon portion 39 serving as a base portion, an $SiO_2$ film 40 (etching target film) formed on the silicon portion 39 and having a thickness of, e.g., about 2600 nm, a polysilicon film 58 formed on the $SiO_2$ film 40, and a residue film 59 made of $SiO_2$ and formed on the polysilicon film 58. The polysilicon film 58 and the residue 59 have a hole 60 for exposing the $SiO_2$ film 40. The residue film 59 is formed of residues of the $SiO_2$ film serving as a hard mask film used for forming the hole 60 in the polysilicon film 58. The polysilicon film 58 and the residue film 59 are inorganic-based films (inorganic films).

Figure 10A:
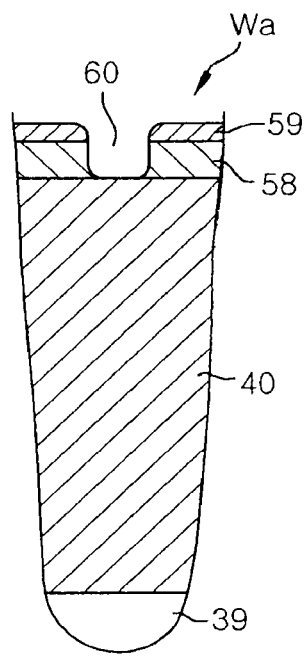
FIGS. 10A to 10C provide process flow diagrams of the etching processing method of the second embodiment.
Figure 10B:
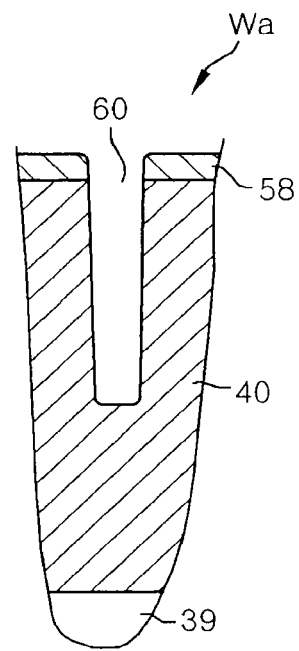
Figure 10C:
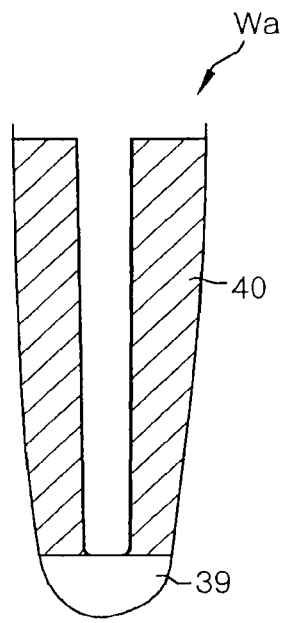

FIGS. 10A to 10C are process flow diagrams showing the etching processing method of the present embodiment.

First, the wafer Wa having a structure shown in FIG. 10A is mounted on the susceptor 12 in the chamber 11 and attracted and held on the electrostatic chuck 23.

Next, the pressure in the chamber 11 is decreased by the gas exhaust line 17 and set to, e.g., about 40 mTorr (5.33 Pa) by an APC valve. Then, a gaseous mixture of HBr gas having a flow rate of, e.g., about 150 sccm, $O_2$ gas having a flow rate of, e.g., about 5 sccm, and $NF_3$ gas having a flow rate of, e.g., about 7 sccm, is introduced from the shower head 26 into the processing space 15. Thereafter, a high frequency power for plasma generation of, e.g., about 900 W, is applied into the processing space 15 without applying a DC power to the upper electrode plate 27, and a high frequency power for ion attraction of, e.g., about 150 W, is applied to the susceptor 12 (pattern shape modification step).

Figure 11A:
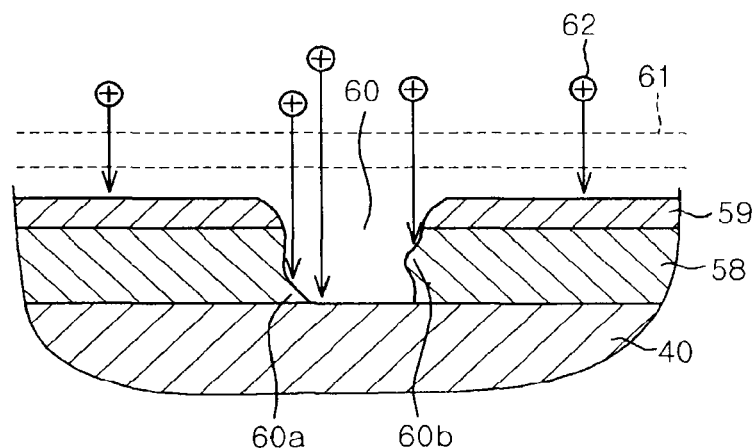
Figure 11B:
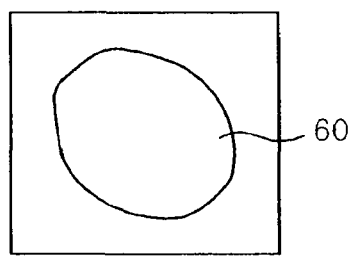
Figure 11C:
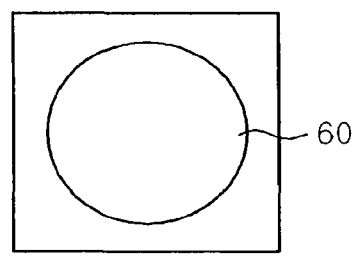
Figure 12:
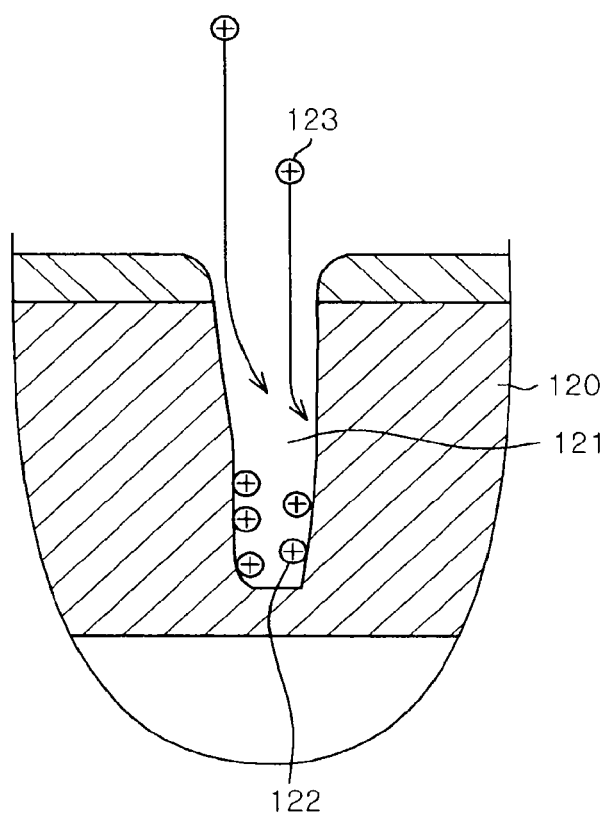
FIG. 12 is a vertical cross sectional view for explaining occurrence of deformation of a hole in a conventional etching processing method.

At this time, as shown in FIG. 11A, the gaseous mixture is excited to generate a plasma, and a sheath 61 is generated above the surface of the wafer Wa. Since the output of the high frequency power for ion attraction is relatively low, the generated sheath 61 is thin and positive ions 62 in the plasma are hardly accelerated. Hence, the polysilicon film 58 and the residue film 59 are lightly sputtered by the positive ions 62. At this time, a foot portion 60a and a protrusion 60b of the hole 60 which mainly cause the deformation of the hole 60 are sputtered and removed first. Moreover, the foot portion 60a and the protrusion 60b chemically react with the radicals in the plasma to be removed. As a result, the shape of the deformed hole 60 shown in FIG. 11B is modified and becomes a substantially round circle shown in FIG. 11C.

When the shape of the hole 60 is modified, any one of halogen-based gases, e.g., $CF_4$ gas, $Cl_2$ gas and the like, may be added, instead of HBr gas and $NF_3$ gas, to the gaseous mixture. Alternatively, a rare gas, e.g., Ar gas, may be further added thereto if necessary.

Moreover, the pressure in the chamber 11, the output value of the high frequency power for plasma generation, the output value of the high frequency power for ion attraction, and the flow rate of the gaseous mixture may be changed if necessary. For example, the pressure in the chamber 11 is set to about 10 mTorr (1.33 Pa), and the gaseous mixture of $CF_4$ gas having a flow rate of, e.g., about 50 sccm, Ar gas having a flow rate of, e.g., 400 sccm, and $O_2$ gas having a flow rate of, e.g., about 20 sccm, may be introduced, instead of the above-described gaseous mixture, into the processing space 15. The high frequency power for plasma generation of, e.g., about 250 W, may be applied to the processing space 15, and the high frequency power for ion attraction of, e.g., about 500 W, may be applied to the susceptor 12, without applying a DC power to the upper electrode plate 27.

Besides, a DC power may be applied to the upper electrode plate 27, if necessary. In that case, the electron density distribution of the plasma in the processing space 15 is improved and, hence, the shape of the hole 60 can be uniformly modified over the entire surface of the wafer W.

Next, the shape of the hole 60 is modified and, then, a hole 51 is formed by plasma etching in the $SiO_2$ film as shown in FIG. 10B. At this time, the processing conditions, e.g., the pressure in the chamber 11, the mixture ratio of various gases included in the gaseous mixture, the output value of the DC power applied to the upper electrode plate 27, the output value of the high frequency power for plasma generation, the output value of the high frequency power for ion attraction, are the same as those of the first embodiment. Especially, the pulse wave form application, the frequencies and the duty ratios of the high frequency power for ion attraction and the high frequency power for plasma generation are the same as those in the first embodiment. Hence, the hole 51 can be formed while neutralizing the positive ions 54 remaining at the bottom portion of the hole 51.

At this time, the polysilicon film 58 and the residue film 59 are not easily removed by the plasma compared to the photoresist film 45 and the like. Therefore, even if the polysilicon film 58 and the residue film 59 is not hardened, they can serve as the mask film during the formation of the hole 51.

Then, when the polysilicon film 58 and the residue film 59 are eroded and removed as shown in FIG. 10C, and the hole 51 is formed in the $SiO_2$ film 40 to allow the silicon portion 39 to be exposed to the bottom portion of the hole 51. At this time, the etching processing method of the present embodiment is completed.

In accordance with the etching processing method of the present embodiment, the shape of the hole 60 formed in the polysilicon film 58 and the residue film 59 are modified, so that it is possible to prevent the shape of the hole 51 formed in the SiO2 film 40 from being affected by the poor shape (deformation or the like) of the hole 60 formed in the polysilicon film 58 and the residue film 59.

When the $SiO_2$ film 40 is etched by the plasma, a DC power of a negative potential is applied to the upper electrode plate 27, and the ion attracting high frequency power 56 is applied in a pulse wave form to the susceptor 12, which result in the state in which the ion attracting high frequency power 56 is not applied to the susceptor 12. Hence, the electrons 53 can be reliably introduced into the bottom portion of the hole 51 formed in the $SiO_2$ film 40.

As a result, even if the aspect ratio of the formed hole 51 is high, it is possible to prevent the swelling of the side portion of the hole 51 or the deformation of the hole 51.

In the etching processing method of the present embodiment, when the hole 51 is formed by the plasma etching, the polysilicon film 58 and the residue film 59 are used as a mask film. However, such film is only slightly removed by the plasma etching. Thus, it is unnecessary to harden the polysilicon film 58 and the residue film 59, and this improves the efficiency of the etching processing method.

In the etching processing methods of the above-described embodiments, the high frequency power for plasma generation and the high frequency power for ion attraction are synchronously applied in a pulse wave form. However, if the sheath above the surface of the wafer W (Wa) can be extinguished, it is unnecessary to synchronously apply the high frequency powers.

Further, in the etching processing methods of the above-described embodiments, when the $SiO_2$ film 40 is etched by the plasma, the high frequency power for plasma generation as well as the high frequency power for ion attraction is applied in a pulse wave form. However, if the sheath above the wafer W (Wa) can be extinguished, it is unnecessary to apply the high frequency power for plasma generation in a pulse wave form.

Although the etching processing method of each of the above-described embodiments is applied to the case where a hole is formed in the oxide film, e.g., the $SiO_2$ film 40, by the plasma etching, it is also applicable to the case where a hole is formed in a nitride film, e.g., SiN film, by the plasma etching.

The etching processing method of each of the above-described embodiments is applied to the substrate processing apparatus 10 in which the high frequency power for plasma generating and the high frequency power for ion attraction are applied to the susceptor 12. However, the etching processing method of each of the above-described embodiments may be applied to a substrate processing apparatus in which the high frequency power for plasma generation is applied to the upper electrode and the high frequency power for ion attraction is applied to the susceptor.

The substrate processing apparatus for performing the etching processing method of each of the above-described embodiments performs a plasma etching process on a substrate. However, a substrate subjected to the plasma etching process is not limited to a wafer for a semiconductor device. It may be various substrates used in a flat panel display (FPD) including a liquid crystal display (LCD) or the like, a photomask, a CD substrate, a printed circuit board or the like.

Although the present invention has been described by using the above-described embodiments, the present invention is not limited to the above-described embodiments.

The purpose of the present invention can be achieved by providing a computer or the like with a storage medium which stores programs of software for realizing the functions of the above-described embodiments and allowing a central processing unit (CPU) of the computer to read and execute the programs stored in the storage medium.

In this case, the functions of the aforementioned embodiments are realized by the programs read from the storage medium, and the present invention includes the programs and the storage medium which stores the programs.

The storage medium for providing the programs stored therein may be, e.g., a RAM, a NV-RAM, a floppy (registered trademark) disk, a hard disk, an optical disk, e.g., CD-ROM, CD-R, CD-RW, DVD (DVD-ROM, DVD-RAM, DVD-RW, DVD+RW) or the like, a magnetic tape; a nonvolatile memory card, a ROM or the like. Alternatively, the programs may be downloaded from database or a computer (not shown) connected to the Internet, a commercial network, a local area network or the like and then supplied to the computer.

The functions of the aforementioned embodiments can be realized by executing the program codes read by the computer. Alternatively, an operating system (OS) or the like operating on the CPU can execute a part or the whole of the actual processing in accordance with the instructions of the program codes, and the functions of the embodiments can be realized by the processing executed by the OS or the like.

In addition, the program codes can be read from a storage and inputted to a memory in a built-in function extension board or an external function extension unit of a computer, and the functions of the embodiments can be realized by the processing of a CPU or the like in the extension board or the extension unit, which executes the extension function thereof according to the instructions of the program codes to perform a part or the whole of the actual processing.

The forms of the program codes may be, e.g., object codes, program codes executed by an interpreter, script data supplied to the OS, or the like.

What is claimed is:

1. An etching processing method for performing an etching process on a substrate mounted on a mounting table, the substrate having an etching target film and a mask film formed thereon, by using a substrate processing apparatus including a processing space where a plasma is generated, the mounting table provided in the processing space, an electrode disposed in the processing space to face the mounting table, a first high frequency power supply for supplying a first high frequency power into the processing space, a second high frequency power supply for supplying to the mounting table a second high frequency power having a frequency lower than a frequency of the first high frequency power, and a DC power supply for supplying a DC power to the electrode, the etching processing method comprising:
a target film etching step for plasma-etching the etching target film by using the mask film,
wherein, in the target film etching step, the DC power is applied to the electrode and the second high frequency power is applied to the mounting table in a pulse wave form that alternates between two consecutive intervals in which a periodic waveform includes a first power level applied during a first interval of the two consecutive intervals, and a second power level lower than the first power level and greater than or equal to zero is applied during a second interval of the two consecutive intervals, and
wherein a total duration of the second interval is longer than a period of the periodic waveform during the first interval, and wherein a peak power of the periodic waveform in the first interval is greater than a peak power in the second interval.

2. The etching processing method of claim 1, wherein, in the target film etching step, a state in which the first high frequency power is not applied into the processing space is obtained by applying the first high frequency power in a pulse wave form into the processing space.

3. The etching processing method of claim 2, wherein, in the target film etching step, the first high frequency power and the second high frequency power are synchronously applied in a pulse wave form.

4. The etching processing method of claim 1, wherein, in the target film etching step, the DC power is applied to the electrode, the DC power having a potential lower than a potential of a bias voltage generated on the substrate.

5. The etching processing method of claim 1, wherein, in the target film etching step, the second high frequency power having a frequency ranging from about 1 KHz to 50 KHz is applied in a pulse wave form to the mounting table.

6. The etching processing method of claim 5, wherein the frequency ranges from about 10 KHz to 50 KHz.

7. The etching processing method of claim 1, wherein, in the target film etching step, a duty ratio of the second high frequency power applied in a pulse wave form ranges from about 10% to 90%.

8. The etching processing method of claim 7, wherein the duty ratio ranges from about 50% to 90%.

9. The etching processing method of claim 1, wherein, in the target film etching step, a state in which the second high frequency power is not applied to the mounting table is continued for at least about 5 μsec.

10. The etching processing method of claim 1, wherein, in the target film etching step, a pattern formed in the etching target film has an aspect ratio of about 30 or higher.

11. The etching processing method of claim 1, wherein the mask film is an organic film, and the method further comprises, before the target film etching step is performed, a mask film hardening step for hardening the mask film by bringing electrons into contact with the mask film etched by the plasma.

12. The etching processing method of claim 11, wherein, in the mask film hardening step, the DC power is applied to the electrode.

13. The etching processing method of claim 12, wherein, in the mask film hardening step, the DC power has a voltage of about −900 V or less.

14. The etching processing method of claim 11, wherein, in the mask film hardening step, the plasma is generated from a depositive gas.

15. The etching processing method of claim 1, wherein the mask film is an inorganic film.

16. The etching processing method of claim 15, wherein the inorganic film has at least a polysilicon film.

17. The etching processing method of claim 1, wherein, in the target film etching step, the plasma is generated from a gaseous mixture containing at least He gas.

18. The etching processing method of claim 1, wherein, in the target film etching step, the second power level corresponds to a state in which the second high frequency power is not applied.

19. The etching processing method of claim 1, wherein a BARC film is used as a mask for the target film.

20. The etching processing method of claim 19, wherein the target film is a silicon-based film.

21. The etching processing method of claim 1, wherein the pulse wave form is generated by modulating the periodic waveform with a square waveform, the square waveform having a frequency less than that of the periodic waveform, and having a duty ratio between 10% and 90%.

* * * * *